United States Patent
Shim et al.

(10) Patent No.: US 8,547,768 B2
(45) Date of Patent: Oct. 1, 2013

(54) VERIFYING MULTI-CYCLE SELF REFRESH OPERATION OF SEMICONDUCTOR MEMORY DEVICE AND TESTING THE SAME

(75) Inventors: Bo-Il Shim, Seoul (KR); Sang-Won Park, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 159 days.

(21) Appl. No.: 13/281,823

(22) Filed: Oct. 26, 2011

(65) Prior Publication Data

US 2012/0134224 A1 May 31, 2012

(30) Foreign Application Priority Data

Nov. 30, 2010 (KR) .................. 10-2010-0120719

(51) Int. Cl.
*G11C 7/00* (2006.01)
(52) U.S. Cl.
USPC .......................................... 365/222; 365/201
(58) Field of Classification Search
USPC ................................ 365/189.08, 200, 201, 222
See application file for complete search history.

(56) References Cited

U.S. PATENT DOCUMENTS

| 5,335,202 A | 8/1994 | Manning et al. |
| 5,450,364 A | 9/1995 | Stephens, Jr. et al. |
| 7,428,181 B2 | 9/2008 | Lee |
| 2006/0114735 A1* | 6/2006 | Takahashi ............ 365/222 |
| 2008/0247256 A1* | 10/2008 | Kim ..................... 365/222 |

FOREIGN PATENT DOCUMENTS

KR     10-0810060     2/2008

* cited by examiner

*Primary Examiner* — Alexander Sofocleous
*Assistant Examiner* — Hien Nguyen
(74) *Attorney, Agent, or Firm* — Volentine & Whitt, PLLC (57) ABSTRACT

A semiconductor memory device includes a memory cell array, a tag information register, a refresh control circuit and a DQ pin. The memory cell array includes multiple memory cells divided into first cells and second cells according to corresponding data retention times. The tag information register stores refresh cycle information for each wordline connected to the first cells and the second cells. The refresh control circuit is configured to generate a refresh enable signal and a refresh address based on the refresh cycle information. The DQ pin is configured to output the refresh enable signal, the refresh address and data stored in the memory cell array.

20 Claims, 9 Drawing Sheets

| ROW\DQ | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 1 | 0 | 0 | 0 | 0 | 0 | 0 | 0 | 0 | 0 | 0 | 0 | 0 | 0 | 0 | 0 | 1 |
| 2 | 1 | 0 | 0 | 0 | 0 | 0 | 0 | 0 | 0 | 0 | 0 | 0 | 0 | 0 | 1 | 0 |
| 3 | 0 | 0 | 0 | 0 | 0 | 0 | 0 | 0 | 0 | 0 | 0 | 0 | 0 | 0 | 1 | 1 |
| 4 | 0 | 0 | 0 | 0 | 0 | 0 | 0 | 0 | 0 | 0 | 0 | 0 | 0 | 1 | 0 | 0 |
| ⋮ | | | | | | | | | | | | | | | | |
| 7998 | 1 | 0 | 0 | 1 | 1 | 1 | 1 | 1 | 1 | 1 | 1 | 1 | 1 | 1 | 0 | 1 |
| 7999 | 0 | 0 | 0 | 1 | 1 | 1 | 1 | 1 | 1 | 1 | 1 | 1 | 1 | 1 | 1 | 0 |
| 8000 | 1 | 0 | 0 | 1 | 1 | 1 | 1 | 1 | 1 | 1 | 1 | 1 | 1 | 1 | 1 | 1 |

211 spans columns 0–15; 212 = column 0; 213 = columns 1–15.

VERIFYING MULTI-CYCLE SELF REFRESH OPERATION OF SEMICONDUCTOR MEMORY DEVICE AND TESTING THE SAME

CROSS-REFERENCE TO RELATED APPLICATIONS

A claim of priority under 35 U.S.C. §119 is made to Korean Patent Application No. 10-2010-0120719, filed on Nov. 30, 2010, in the Korean Intellectual Property Office, the entire contents of which are hereby incorporated by reference.

BACKGROUND

Illustrative embodiments relate to semiconductor devices, and more particularly to a semiconductor memory device and a method of verifying multi-cycle self refresh and a test system using the method.

In general, DRAM cells store data in capacitors as a configuration of electrical charges, and the electrical charges (data) may be lost due to leakage current. Therefore, the lost data needs to be restored in the DRAM cells to prevent the data from being permanently lost, which is referred to as refresh operation.

However, DRAM cells may have different data retention characteristics. That is, some DRAM cells may have data retention times shorter than other DRAM cells. The refresh operation must therefore be performed based on the DRAM cells having the shortest data retention times, which requires more power consumption.

SUMMARY

Various embodiments provide a semiconductor memory device capable of verifying a multi-cycle self refresh operation, a method of verifying a multi-cycle self refresh operation in a semiconductor memory device, and a test system using the method.

According to illustrative embodiments, a semiconductor memory device includes a memory cell array, a tag information register, a refresh control circuit and an output. The memory cell array includes multiple memory cells divided into first cells and second cells according to corresponding data retention times. The tag information register stores refresh cycle information for each wordline connected to the first cells and the second cells. The refresh control circuit is configured to generate a refresh enable signal and a refresh address based on the refresh cycle information. The output is configured to transmit the refresh enable signal, the refresh address and data stored in the memory cell array externally.

In various embodiments, a data retention time of each of the first cells is shorter than a data retention time of each of the second cells.

In various embodiments, the refresh enable signal applied to each wordline has a logic level depending on whether the wordline is connected to a row including at least one first cell. The refresh enable signal may be consecutively applied twice to wordlines connected to rows including at least one first cell, and the refresh enable signal may be applied once to a row including second cells and not including at least one first cell.

In various embodiments, a cycle of a self refresh operation performed on the memory cell array based on the refresh address may be set individually with respect to each wordline.

In various embodiments, the refresh control circuit may include an oscillator that generates a pulse signal in response to a refresh command, an address counter that generates the refresh address in synchronization with the pulse signal, and a refresh enable signal generator that generates the refresh enable signal, which is selectively enabled according to a corresponding wordline based on the refresh cycle information.

In various embodiments, the refresh cycle information may also be transmitted externally through the output.

According to illustrative embodiments, a method is provided for verifying a multi-cycle self refresh operation of a semiconductor memory device including a memory cell array. The method includes storing first self refresh performance information with respect to each wordline of multiple wordlines, connected to the memory cell array, in a first register of a tester through a DQ pin, the first self refresh performance information being associated with a first self refresh operation performed on memory cells in the memory cell array according to refresh cycle information of each wordline stored in a tag information register; storing a second self refresh performance information with respect to each wordline in a second register in the tester through the DQ pin, the second self refresh performance information being associated with a second self refresh operation performed on the memory cells according to the refresh cycle information; and determining whether a multi-cycle self refresh operation is performed on the memory cells based on the refresh cycle information, the first self refresh performance information and the second self refresh performance information.

In various embodiments, determining whether the multi-cycle self refresh operation is performed may include storing identification information in a third register in the tester by performing an AND operation on the first self refresh performance information stored in the first register and the second self refresh performance information stored in the second register; and determining whether the identification information stored in the third register is identical to the refresh cycle information. Determining whether the identification information stored in the third register is identical to the refresh cycle information may include performing an exclusive NOR operation on the identification information and the refresh cycle information.

In various embodiments, the first self refresh performance information may include whether the refresh enable signal applied to each wordline is enabled and a row address designating each wordline associated with the first self refresh operation. The second self refresh performance information may include whether the refresh enable signal applied to each wordline is enabled and a row address designating each wordline associated with the second self refresh operation.

In various embodiments, the refresh enable signal may be applied to wordlines connected to at least one first cell having a data retention time shorter than a data retention time of second cells when the first self refresh operation is performed. The refresh enable signal may be applied to each wordline without regard to whether at least one first cell is connected when the second self refresh operation is performed.

In various embodiments, a cycle of self refresh operation performed on the memory cells based on the refresh address may be set individually with respect to each wordline.

According to illustrative embodiments, a test system includes a test board and a tester. The test board includes a socket on which a semiconductor memory device to be tested is mounted. The semiconductor memory device performs a multi-cycle self refresh operation using refresh cycle information of each row address stored in a tag information register. The tester is configured to verify the multi-cycle self refresh operation performed in the semiconductor memory device based on a refresh address, a refresh enable signal according to the refresh address and the refresh cycle information. The refresh address and the refresh enable signal are output when a refresh operation is performed in the semiconductor memory device.

In various embodiments, the tester may include first, second, third and fourth registers. The first register may store first self refresh performance information associated with a first self refresh operation performed on memory cells in the semiconductor memory device. The second register may store second self refresh performance information associated with a second self refresh operation performed on the memory cells. The third register may store a result of an AND operation performed on the first self refresh performance information and the second self refresh performance information. The fourth register may store the refresh cycle information of each row address.

The tester may further include an exclusive NOR gate that performs an exclusive NOR operation on the result of the AND operation stored in the third register and the refresh cycle information stored in the fourth register.

In various embodiments, the refresh address and whether the refresh enable signal is enabled are transmitted to the tester through a DQ pin of the semiconductor memory device.

Accordingly, illustrative embodiments provide for easily testing multi-cycle self refresh operations in semiconductor memory devices, thus reducing power consumption.

BRIEF DESCRIPTION OF THE DRAWINGS

Illustrative embodiments will be more clearly understood from the following detailed description taken in conjunction with the accompanying drawings.

DETAILED DESCRIPTION OF THE EMBODIMENTS

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms first, second, third etc. may be used herein to describe various elements, these elements should not be limited by these terms. These terms are used to distinguish one element from another. Thus, a first element discussed below could be termed a second element without departing from the present teachings. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
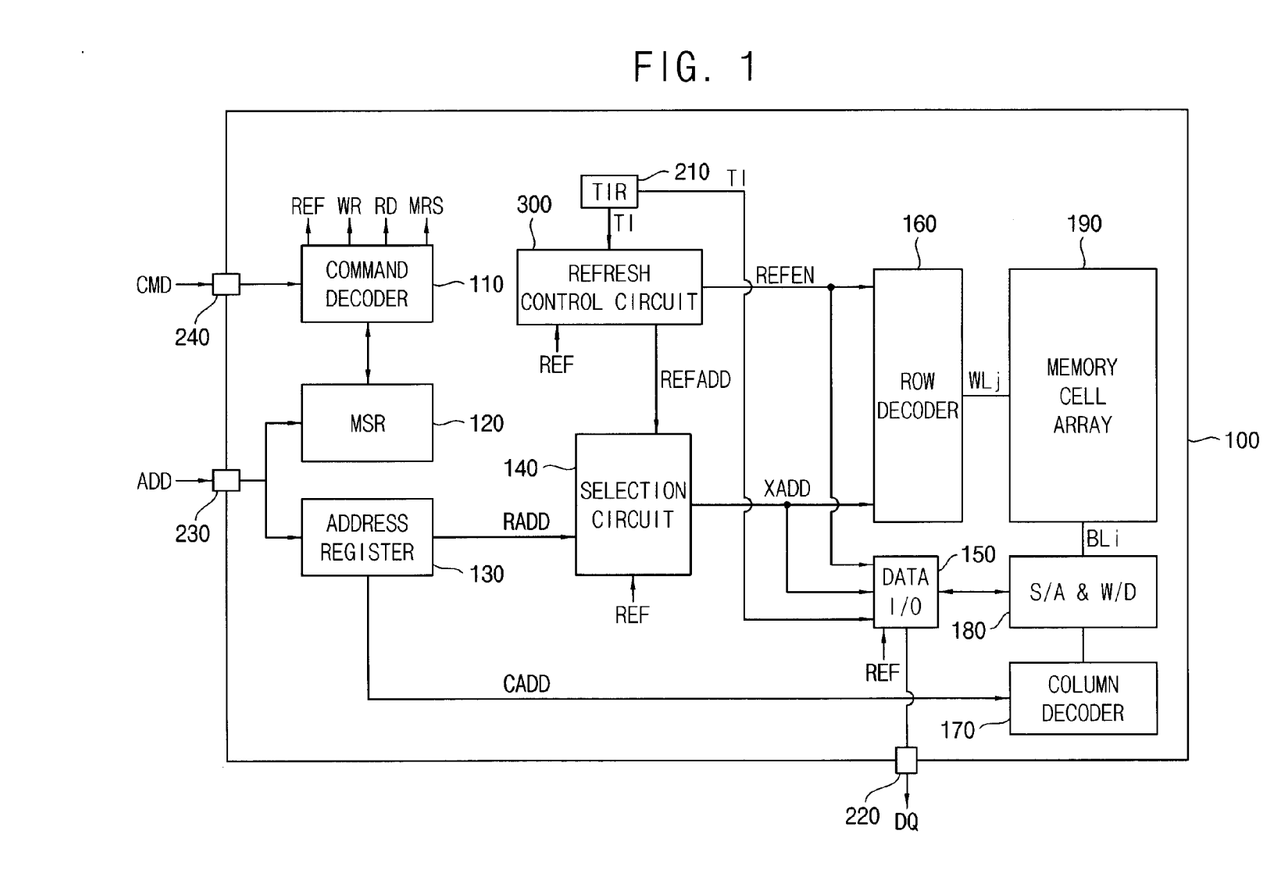
FIG. 1 is a block diagram illustrating a semiconductor memory device, according to illustrative embodiments.

FIG. 1 is a block diagram illustrating a semiconductor memory device, according to illustrative embodiments.

Referring to FIG. 1, a semiconductor memory device 100 includes a command decoder 110, a mode set register (MSR) 120, an address register 130, a selection circuit 140, a data input/output circuit (DATA I/O) 150, a row decoder 160, a write/read circuit (S/A & W/D) 180, a memory cell array 190, a tag information register (TIR) 210 and a refresh control circuit 300.

The command decoder 110 receives a command CMD applied externally through a command pin 240. The command decoder 110 decodes the command CMD to generate a refresh command REF, a write command WR, a read command RD and a mode register set command MRS. In addition, the command decoder 110 provides the refresh command REF, the write command WR, the read command RD and the mode register set command MRS to corresponding circuit blocks, respectively. For example, the command decoder 110 may provide the refresh command REF to the refresh control circuit 300, the selection circuit 140 and the data input/output circuit 150.

The mode set register (MSR) 120 determines operation mode of the semiconductor memory device 100 based on an external address ADD received through an address pin 230 and the mode register set command MRS received from the command decoder 110. In general, the semiconductor memory device 100 sequentially enters into a mode register set mode and extended mode register set (EMRS) mode while executing operations. The EMRS mode includes a retention verification mode, where retention characteristics of memory cells may be tested in the EMRS mode.

The TIR 210 may store refresh cycle information (or tag information TI) of each of the memory cells included in the memory cell array 190, and each refresh cycle may be set based on the retention characteristic of each of the memory cells, which is tested in the retention verification mode. The refresh cycle information stored in the TIR 210 may be referred to for controlling the self refresh cycle of each of the wordlines connected to the memory cell array 190 when performing a refresh operation on the memory cell array 190. In addition, the refresh cycle information stored in the TIR 210 may be transmitted externally through an output pin, indicated by DQ pin 220, for example. The refresh cycle information stored in the TIR 210 also may include a row address (refresh address) designated for each of the wordlines and information on whether a refresh enable signal REFEN applied to each of the wordlines is enabled.

The refresh control circuit 300 generates a refresh address REFADD and the refresh enable signal REFEN based on the refresh command REF and the tag information TI on the refresh cycle information. The refresh address REFADD is provided to the selection circuit 140 and the refresh enable signal REFEN is provided to the row decoder 160.

The address register 130 temporarily stores the external address ADD received through the address pin 230, provides a row address RADD of the external address ADD to the row decoder 160 and provides a column address CADD of the external address ADD to the column decoder 170.

The selection circuit 140 selects one of the refresh address REFADD and the row address RADD as a selected row address XADD to be provided to the row decoder 160, in response to the refresh command REF. For example, the selection circuit 140 may select the refresh address REFADD as the selected row address XADD when the refresh command REF has a first logic level indicating a self refresh operation, and the selection circuit 140 may select the row address RADD as the selected row address XADD when the refresh command REF has a second logic level indicating a write or read operation.

The data input/output circuit 150 provides the read/write circuit 180 with data to be written in the memory cell array 190, or receives from the read/write circuit 180 data read from the memory cell array 190, in response to the refresh command REF. In addition, the data input/output circuit 150 externally outputs the tag information TI, the refresh address REFADD and the information on whether refresh enable signal REFEN is enabled through the DQ pin 220 in response to the refresh command REF.

The row decoder 120 sequentially selects the wordlines WLi in response to the refresh address REFADD from the selection circuit 140 in a self refresh mode. Whether the selected wordline is enabled is determined based on the refresh enable signal REFEN from the refresh control circuit 300 while the wordlines WLj are sequentially selected.

The column decoder 170 decodes the column address CADD from the address register 130 to select at least one of bitlines BLi (or columns) in response to the decoded column address CADD.

The memory cell array 190 includes multiple memory cells (not illustrated) connected to multiple bitlines BLi (where i is a natural number greater than two) and multiple wordlines WLj (where j is a natural number greater than two). The memory cells may be divided into two groups, respectively identified as first cells and second cells, according to the data retention characteristics (or data retention times) of each of the memory cells. The first cells are able to store data without being refreshed for a time shorter than a reference interval. The second cells are able to store data without being refreshed for a time longer than the reference interval. That is, the first cells may not pass a data retention test, and the second cells may pass the data retention test using the reference interval, since each of the first cells have a shorter data retention time. Therefore, the first cells must be refreshed more frequently than the second cells, because the first cells retain data without being lost for a shorter time than the second cells. Accordingly, a first refresh cycle of the first cells is shorter than a second refresh cycle of the second cells. For example, the first cells may be refreshed twice as often as the second cells.

Although not illustrated, the memory cell array 100 may include multiple memory banks. Each of the memory banks may be divided into memory blocks, and each of the memory blocks may be divided into multiple memory pages.

The read/write circuit 180 writes data in the memory cell array 190 or reads data from the memory cell array 190.

Figure 2:
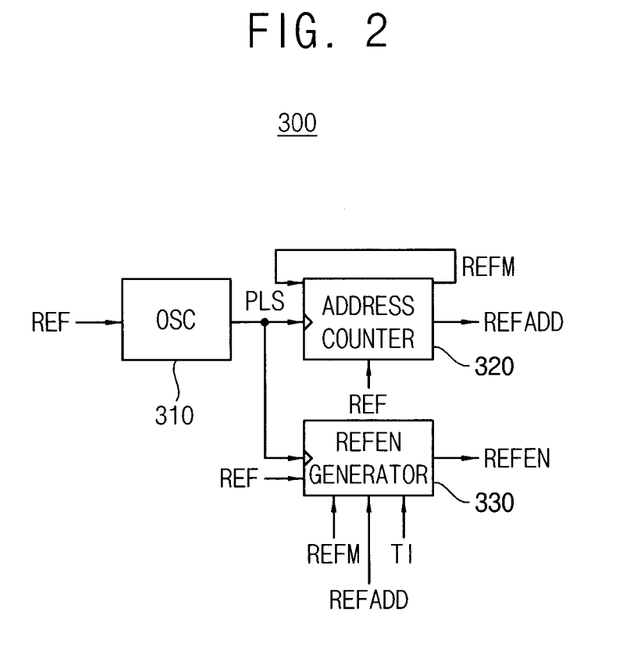
FIG. 2 is a block diagram illustrating an example of the refresh control circuit in FIG. 1, according to illustrative embodiments.

FIG. 2 is a block diagram illustrating an example of the refresh control circuit in FIG. 1, according to illustrative embodiments.

Referring to FIG. 2, the refresh control circuit 300 includes an oscillator 310, an address counter 320 and a refresh enable signal generator 330. The oscillator 310 generates a pulse signal PLS with a regular period (cycle) in response to the refresh command REF. The address counter 320 generates the refresh address REFADD for designating row addresses to be refreshed and provides the refresh address REFADD to the selection circuit 140, in response to the refresh command REF. The address counter 320 may finish the counting operation in response to a self refresh exit signal from the command decoder 110. The address counter 320 operates in synchronization with the pulse signal PLS. The address counter 320 sequentially generates the refresh address REFADD by counting from a starting refresh address. The counting operation may be an up-counting operation or a down-counting operation. When the refresh address REFADD comes to an ending refresh address REFM, the address counter 320 is initialized to count from the starting refresh address.

The refresh enable signal generator 330 operates in synchronization with the pulse signal PLS and generates the refresh enable signal REFEN determining whether the wordline designated by the refresh address REFADD is enabled, based on the refresh command REF, the tag information TI and the ending refresh address REFM. That is, the refresh enable signal generator 330 generates the refresh enable signal REFEN determining whether the wordline designated by the refresh address REFADD is enabled.

Figure 3:
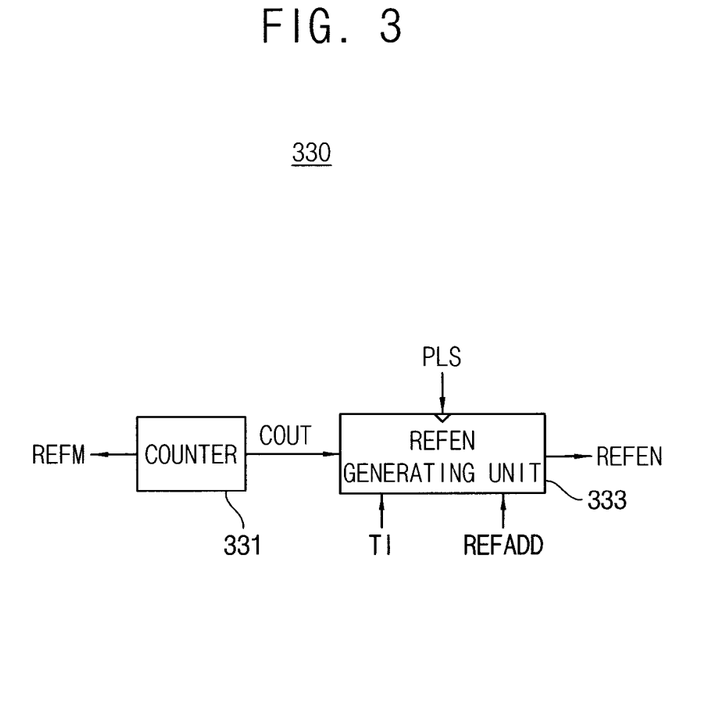
FIG. 3 is a block diagram illustrating the refresh enable signal generator in FIG. 2, according to illustrative embodiments.

FIG. 3 is a block diagram illustrating the refresh enable signal generator in FIG. 2, according to illustrative embodiments.

Referring to FIG. 3, the refresh enable signal generator 330 includes a counter 331 and a refresh enable signal generating unit 333. The counter 331 counts the ending refresh address REFM from the address counter 320 to output a counting output signal COUT. For example, when the refresh operation starts, the counting output signal COUT may correspond to "0," and when the refresh address REFADD comes to the ending refresh address REFM, the counting output signal COUT may correspond to "1." The refresh enable signal generating unit 333 generates the refresh enable signal REFEN based on the tag information TI and the refresh address REFADD and by changing operation mode whenever the value of the counting output signal COUT is changed.

For example, while a first self refresh operation is performed on a memory cell and the counting output signal COUT has a value of "0," the refresh enable signal generating unit 333 may generate the refresh enable signal REFEN, which is selectively enabled according to the refresh cycle information included in the tag information TI, based on the refresh address REFADD and the tag information TI. In addition, for example, while a second self refresh operation is performed on the memory cell and the counting output signal COUT has a value of "1," the refresh enable signal generating unit 333 may generate the refresh enable signal REFEN, which is enabled without regard to the refresh cycle information based on the refresh address REFADD and the tag information TI. More particularly, while the first self refresh operation is performed on the memory cell, the refresh enable signal REFEN, which is enabled, is applied to the wordlines connected to the first cells of the memory cell array 190, and the refresh enable signal REFEN, which is disabled, is applied to the wordlines connected to the second cells of the memory cell array 190. That is, while the first self refresh operation is performed on the memory cell, the refresh operation is performed on rows including at least one first cell. In addition, while the first self refresh operation is performed on the memory cell, the refresh operation is sequentially performed on all rows without regard to the row including at least one first cell. Therefore, the first self refresh operation and the second self refresh operation are sequentially performed on the row including the at least one first cell, and the second self refresh operation is performed on the row not including the first cell.

Figure 4:
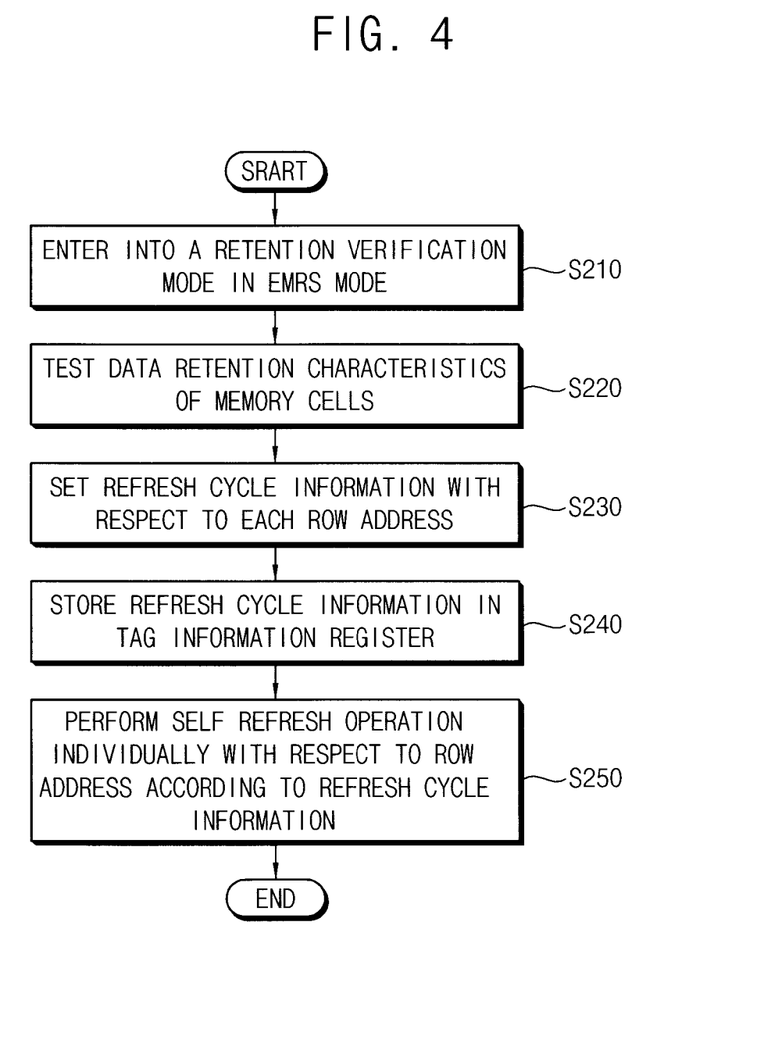
FIG. 4 is a flow chart illustrating a method of storing the refresh cycle information in the tag information register, according to illustrative embodiments.

FIG. 4 is a flow chart illustrating a method of storing the refresh cycle information in the tag information register, according to illustrative embodiments.

Referring to FIGS. 1 and 4, the semiconductor memory device 100 enters into the retention verification mode in the EMRS mode by the mode set register 120 (S210). Data retention characteristics of the memory cells are tested in the retention verification mode (S220). The memory cells are divided into first cells and the second cells according to the data retention characteristics of the memory cells. The refresh cycle information with respect to each row address (wordline) is set according to the data retention characteristics of the memory cells (S230). For example, the first refresh cycle with respect to row addresses (wordlines) including at least one first cell is set to be shorter than the second refresh cycle with respect to row addresses (wordlines) not including at least one first cell. The refresh cycle information with respect to each row address (wordline) is stored in the TIR 210 (S240). The self refresh operation is performed on the memory cell array 190 individually with respect to the row addresses according to the corresponding refresh cycle information stored in the TIR 210 (S250).

Figure 5:
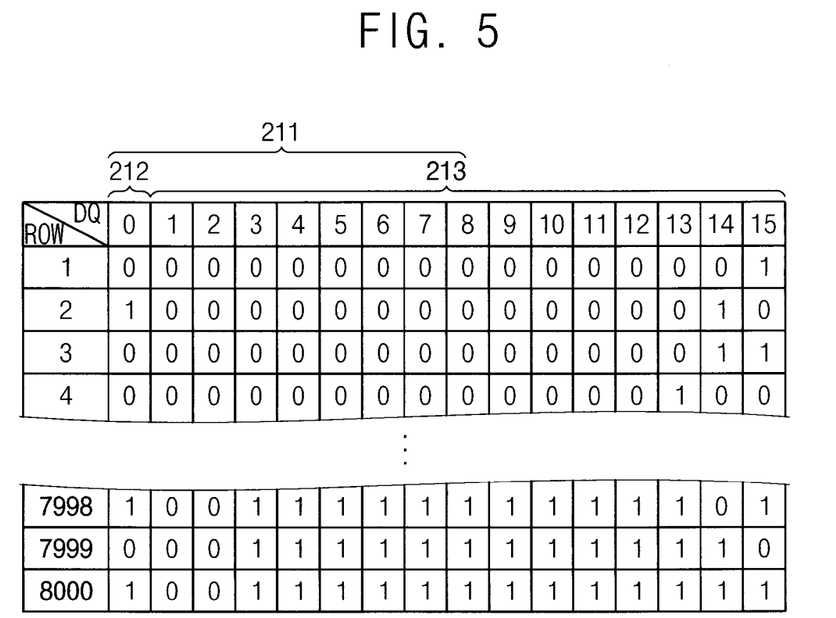
FIG. 5 illustrates the refresh cycle information stored in the tag information register in FIG. 1, according to illustrative embodiments.

FIG. 5 illustrates an example of the refresh cycle information stored in the tag information register in FIG. 1, according to illustrative embodiments.

Referring to FIG. 5, the TIR 210 stores the refresh cycle information of each of the row addresses (wordlines) based on the data retention characteristics of the corresponding memory cells. The refresh cycle information stored in the TIR 210 may be transmitted externally through the DQ pin 220 for verifying the self refresh operation. In FIG. 5, a semiconductor memory device having 4 Gb memory capacity is taken as an example. When each memory block includes 8K wordlines, the number of required address pins is thirteen (A0~A12). The refresh cycle information 211 stored in the TIR 210 is output through the DQ pin 220, and thus the refresh cycle information 211 includes sixteen bits each corresponding to each of DQ pins DQ0~DQ15. The refresh cycle information 211 may be divided into a first part 212 and a second part 213. The first part 212 of the refresh cycle information 211 indicates whether the refresh enable signal REFEN is enabled, and the second part 213 of the refresh cycle information 211 indicates the row address designating each wordline. For example, a refresh cycle with respect to a wordline including at least one first cell may be set to a first refresh cycle (for example, 64 ms), and a refresh cycle with respect to a wordline not including at least one first cell may be set to a second refresh cycle (for example, 128 ms). In FIG. 5, when the first part 212 of the refresh cycle information 211 has a value "1," the refresh cycle with respect to the corresponding row address (wordline) is the first refresh cycle (for example, 64 ms), and when the first part 212 of the refresh cycle information 211 has a value "0," the refresh cycle with respect to the corresponding row address (wordline) is the second refresh cycle (for example, 128 ms).

Figure 6:
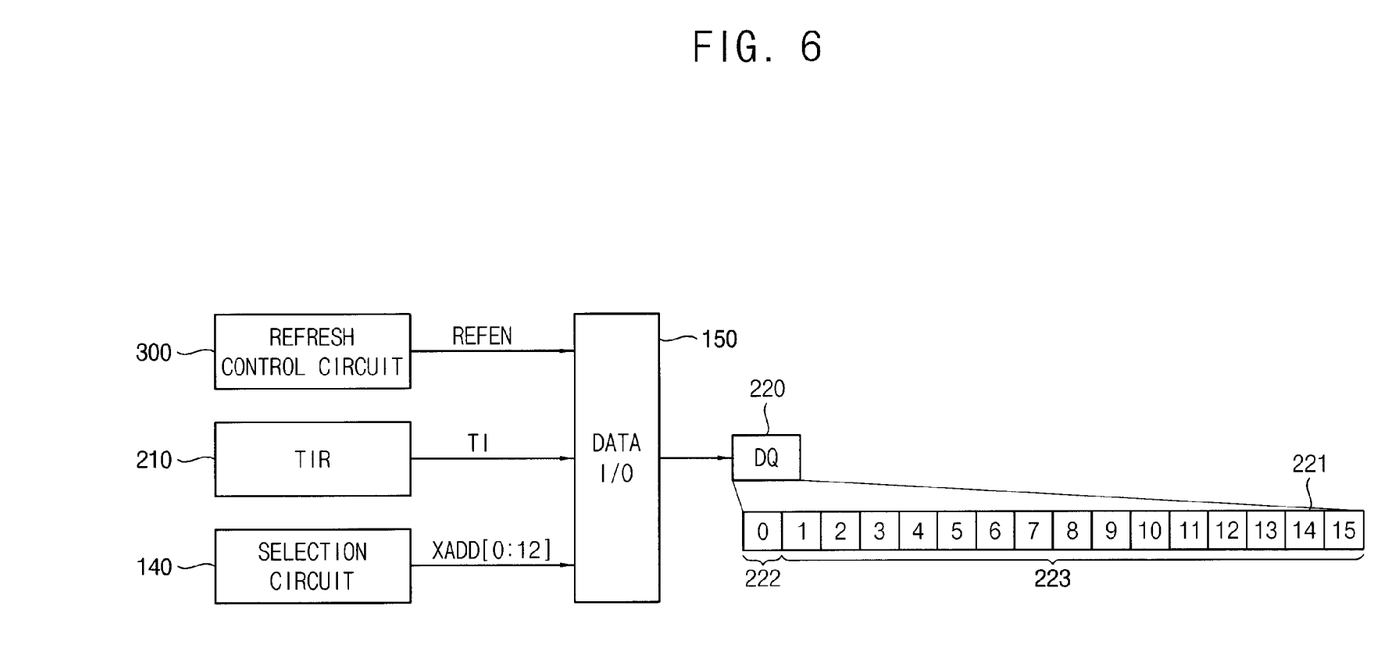
FIG. 6 is a block diagram illustrating that multi-cycle self refresh operation is verified in the semiconductor memory device of FIG. 1, according to illustrative embodiments.

FIG. 6 is a block diagram illustrating that multi-cycle self refresh operation is verified in the semiconductor memory device of FIG. 1, according to illustrative embodiments.

The multi-cycle self refresh operation has some merits of reducing power consumption in a standby mode by varying self refresh cycles of the first cells having a shorter data retention time and the second cells having a longer data retention time. However, whether the multi-cycle self refresh operation has been performed normally may not be verified in the conventional semiconductor memory device.

Referring to FIGS. 5 and 6, the refresh enable signal REFEN and the refresh address XADD may be transmitted externally through the data input/output circuit 150 and the DQ pin 220 as refresh performance information. When the refresh enable signal REFEN and the refresh address XADD are transmitted externally through the data input/output circuit 150 and the DQ pin 220 as the refresh performance information, sixteen DQ pins may be used. The most significant bit, i.e., a first part 222 of refresh performance information 221, indicates whether the refresh enable signal REFEN is enabled, and a second part 223 of the refresh performance information 221 indicates a row address designating a corresponding wordline. For example, when the self refresh operation is performed with the first refresh cycle of 64 ms, the first part 222 having a value of "0" indicates that the self refresh operation is not performed on the corresponding row designated by the second part 223. In addition, the first part 222 having a value of "1" indicates that the self refresh operation is performed on the corresponding row designated by the second part 221. In addition, the refresh cycle information 211 stored in the TIR 210 also may be transmitted externally through the data input/output circuit 150 and the DQ pin 220.

Figure 7:
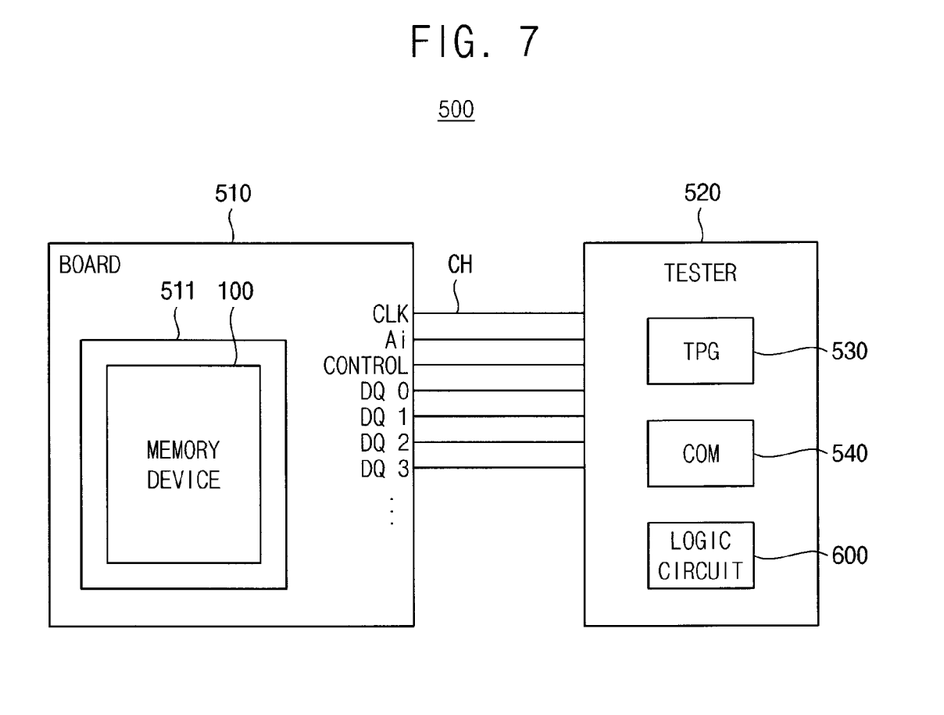
FIG. 7 is a block diagram illustrating a test system, according to illustrative embodiments.

FIG. 7 is a block diagram illustrating a test system according to some example embodiments.

Testing a semiconductor memory chip is the final process determining whether the semiconductor memory chip is passed. Referring to FIG. 7, a test system 500 includes a test board 510 and a tester 520.

The test board 510 includes a socket 511 on which a semiconductor memory device to be tested is mounted, a clock pin CLK for transferring a clock signal, address pins Ai (i is an integer between 0 and n) for transferring address signal, a control pin CONTROL for transferring control signals such as RAS, CAS, WE, CKE, CS, DQM and DQS, data input/output pins DQ0, DQ1, . . . and a reference voltage pin (not illustrated).

The semiconductor memory device 100 is mounted on the socket 511 in the test board 510. The semiconductor memory device 100 may be x16 memory chip or x32 memory chip, for example. The semiconductor memory device 100 may include a clock pin, address pins, a control pin and data input/output pins although not illustrated. Each of the pins of the semiconductor memory device 100 is connected to a corresponding pin of the test board 510.

The tester 520 includes a test pattern generator (TPG) 530, a comparator (COM) 540 and a logic circuit 600. The test pattern generator 530 generates test pattern data. The comparator 540 compares data transmitted from the semiconductor memory device 100 with reference data. In addition, the tester 520 may also include driving pins (not illustrated) connected to the test pattern generator 530 and/or comparing pins (not illustrated) connected to the comparator 540. The test board 510 is connected to the tester 520 through multiple channels CH. The logic circuit 600 verifies multi-cycle self refresh operations of the semiconductor memory device 100.

The tester 520 applies the test pattern data generated by the test pattern generator 530 to the semiconductor memory device 100 through driving pins and receives output data from the semiconductor memory device 100 in response to the applied test pattern data. The tester 520 determines whether the semiconductor memory device 100 is passed by measuring the output data from the semiconductor memory device 100 in the comparator 540.

Figure 8:
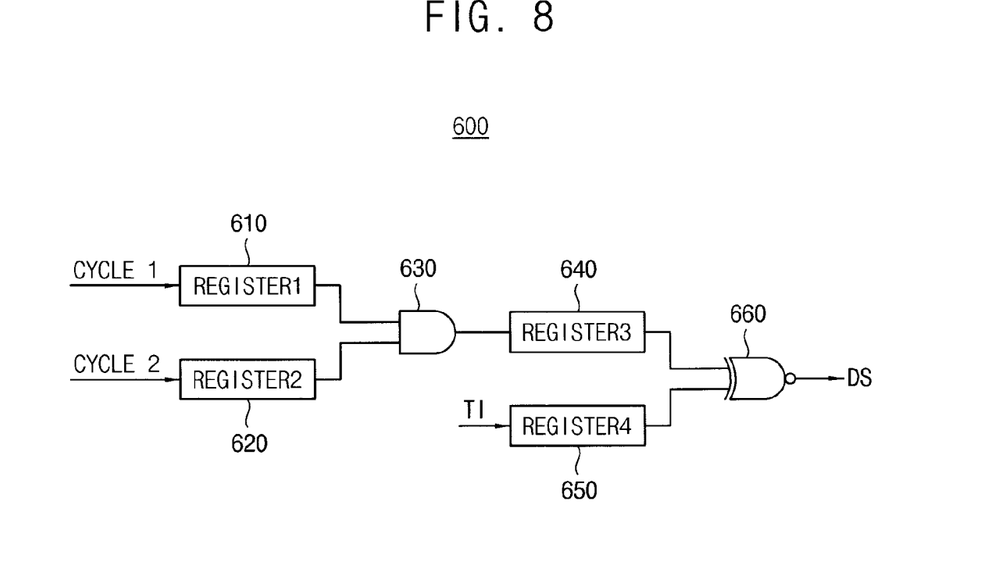
FIG. 8 is a circuit diagram illustrating an example of the logic circuit in FIG. 7, according to illustrative embodiments.
Figure 9:
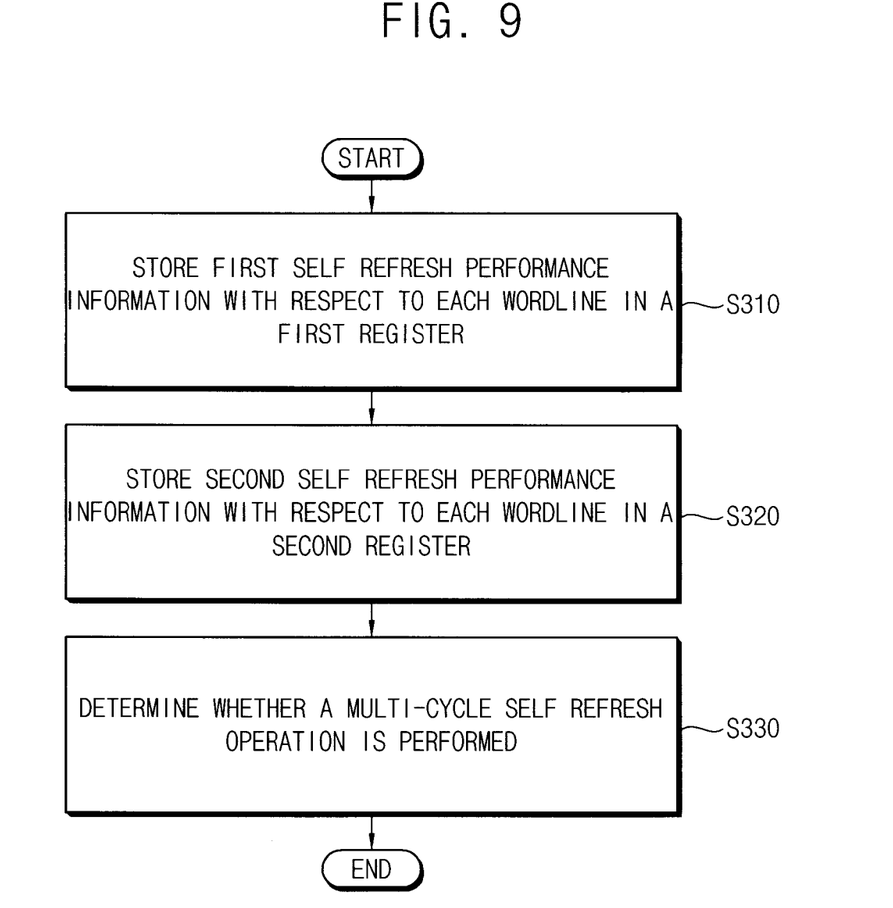
FIG. 9 is a flow chart illustrating a method of verifying a multi-cycle self refresh operation, according to illustrative embodiments.

FIG. 8 is a circuit diagram illustrating an example of the logic circuit 600 in FIG. 7 according to illustrative embodiments. FIG. 9 is a flow chart illustrating a method of verifying a multi-cycle self refresh operation, according to illustrative embodiments.

Referring to FIG. 8, the depicted logic circuit 600 includes a first register 610, a second register 620, an AND gate 630, a third register 640, a fourth register 650 and an exclusive NOR gate 660.

Referring to FIGS. 1, 2, 3, 8 and 9, the refresh control circuit 300 performs a first self refresh operation on the memory cell array 190 by referring to the refresh cycle information (or tag information TI) stored in the TIR 210, and stores in the first register 610 through the DQ pin 220 first self refresh performance information CYCLE1 of each wordline, associated with the first self refresh operation (S310 of FIG. 9). The first self refresh performance information is denoted as CYCLE1 in FIG. 8, and first self refresh performance information may include row addresses (refresh address) designating respective wordlines and information regarding whether the refresh enable signal REFEN applied to corresponding wordline is enabled.

The refresh control circuit 300 performs a second self refresh operation on the memory cell array 190 by referring to the refresh cycle information (or tag information TI) stored in the TIR 210, and stores in the second register 620 through the DQ pin 220 a second self refresh performance information CYCLE2 of each wordline, associated with the second self refresh operation (S320). The second self refresh performance information is denoted as CYCLE2 in FIG. 8, and second self refresh performance information may include row addresses (refresh address) designating respective wordlines and information regarding whether the refresh enable signal REFEN applied to corresponding wordline is enabled. The first and second self refresh operations may be performed with same cycles, the first self refresh operation is performed on rows including at least one first cell having a data retention time is shorter than the second cell, and the second self refresh operation is performed on every row without regard to whether at least one first cell is included. Therefore, a row which does not include at least one first cell has a longer refresh cycle (e.g., two times longer) than a row including the at least one first cell. Whether a multi-cycle self refresh operation is performed on the memory cells in the memory cell array 190 is determined based on the refresh cycle information TI, the first self refresh performance information CYCLE1 and the second self refresh performance information CYCLE2.

Figure 10:
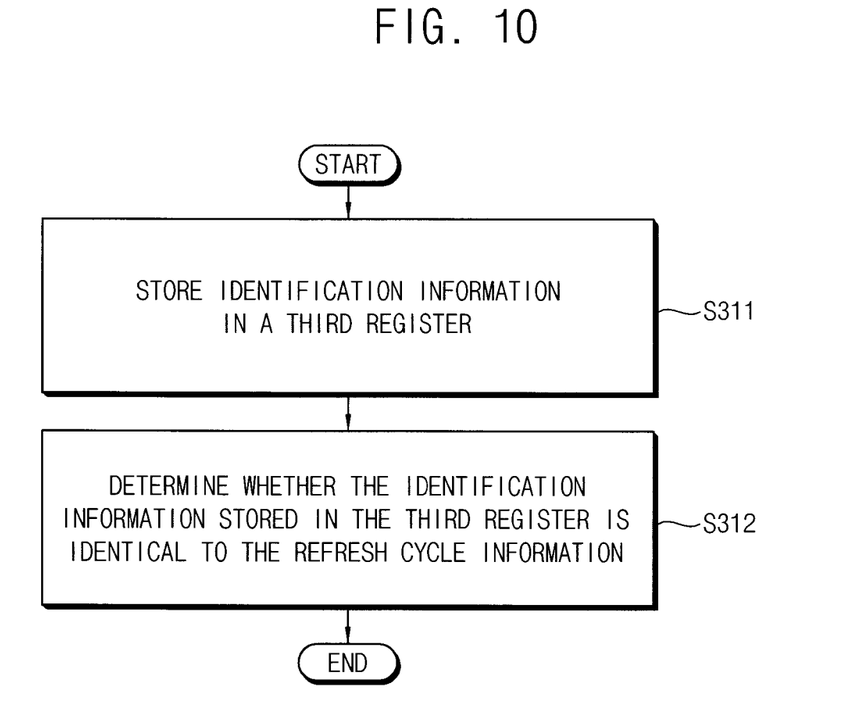
FIG. 10 is a flow chart illustrating in detail the step of determining the multi-cycle self refresh operation in FIG. 9, according to illustrative embodiments.

FIG. 10 is a flow chart illustrating in detail the step of determining the multi-cycle self refresh operation in FIG. 9, according to illustrative embodiments.

Referring to FIG. 10, for determining whether the multi-cycle self refresh operation is performed on the memory cells in the memory cell array 190, a logical AND operation using the AND gate 630 is performed on the first self refresh performance information CYCLE1 stored in the first register 610 and the second self refresh performance information CYCLE2 stored in the second register 620, and a result of the AND operation is stored in the third register 640 as identification information (S311). Therefore, whether the first self refresh performance information CYCLE1 is identical to the second self refresh performance information CYCLE2 is determined based on the identification information stored in the third register 640 (S312).

A logical exclusive NOR operation is performed on the identification information stored in the third register 640 and the refresh cycle information TI stored in the fourth register 650 using the exclusive NOR gate 660, and a decision signal DS indicating whether the multi-cycle self refresh operation is performed on the memory cells in the memory cell array 190 is provided. For example, the decision signal DS may have a logic high level when the identification information for one row stored in the third register 640 is identical to the refresh cycle information TI for a corresponding row stored in the fourth register 650. In addition, the decision signal DS may have a logic low level when the identification information for one row stored in the third register 640 is not identical to the refresh cycle information TI for a corresponding row stored in the fourth register 650.

It is understood that various illustrative embodiments may include verifying multi-cycle self refresh operations that are performed with three or more different refresh cycles, without departing from the scope of the present teachings.

FIGS. 11A to 11D respectively illustrate data stored in the registers in FIG. 8, according to illustrative embodiments.

Referring to FIGS. 2 and 7 through 11D, the oscillator 310 generates the pulse signal PLS having a cycle of 64 ms, for example, provided to the address counter 320 and the refresh enable signal generator 330, in response to the refresh command REF. The address counter 320 outputs the refresh address REFADD at every rising edge of the pulse signal PLS, and the refresh enable signal generator 330 generates the refresh enable signal REFEN at a rising edge of the pulse signal PLS, based on the refresh address REFADD and the refresh cycle information TI.

When the first and second self refresh operations are sequentially performed, whether the refresh operation is performed on every row is checked, because the refresh operation must be more frequently performed on the rows that include at least one first cell, having a data retention time shorter than a data retention time of the second cell, than on the rows that do not include at least one first cell. Therefore, the first self refresh operation is performed only on the rows including at least one first cell, and the second self refresh operation is performed on every row. Accordingly, the rows including at least one first cell may have a refresh cycle of 64 ms, for example, and the rows not including at least one first cell may have a refresh cycle of 128 ms, for example.

Figure 11A:
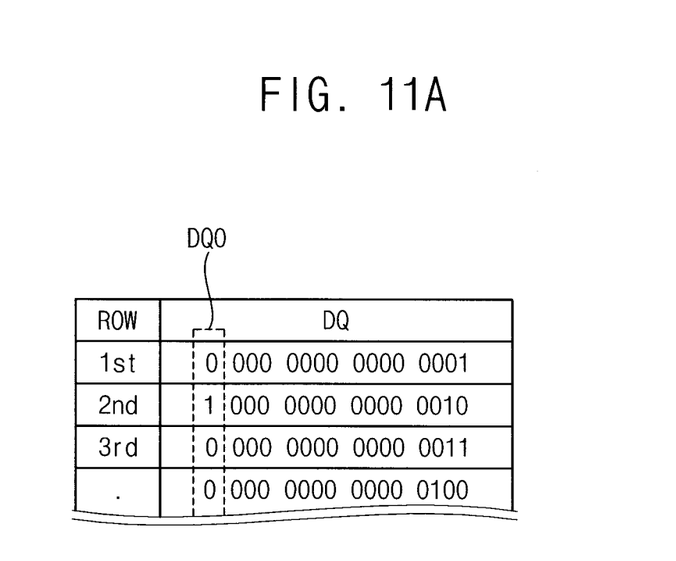
FIG. 11A illustrates the first self refresh performance information stored in the first register in FIG. 8, according to illustrative embodiments.

FIG. 11A illustrates the first self refresh performance information stored in the first register in FIG. 8, according to illustrative embodiments.

Referring to FIG. 11A, the tester 520 stores the first self refresh performance information CYCLE1 in the first register 610 when the semiconductor memory device 100 outputs the row address XADD and the logic level of the refresh enable signal REFEN generated in the first self refresh operation through the DQ pin 220. A most significant bit DQ0 represents the logic level of the refresh enable signal REFEN (whether the refresh operation is performed on the corresponding wordline), and other bits represent the row address of the corresponding wordline. In the depicted example, the most significant bit DQ0 having a value of "0" indicates that the first self refresh operation is not performed on the corresponding wordline, and the most significant bit DQ0 having a value of "1" indicates that the first self refresh operation is performed on the corresponding wordline.

For example, the most significant bit DQ0 for a second row has a value of "1," which indicates that the first self refresh operation is performed on the corresponding wordline, and the most significant bit DQ0 for first and third rows has a value of "0," which indicates that the first self refresh operation is not performed the corresponding wordline. That is, it is noted that the second row includes at least one first cell.

Figure 11B:
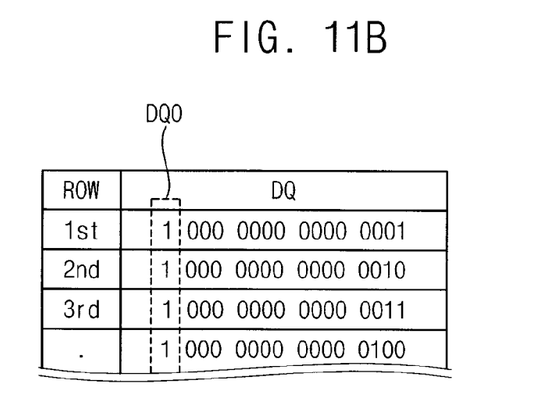
FIG. 11B illustrates the second self refresh performance information stored in the second register in FIG. 8, according to illustrative embodiments.

FIG. 11B illustrates the second self refresh performance information stored in the second register in FIG. 8, according to illustrative embodiments.

Referring to FIG. 11B, the tester 520 stores the second self refresh performance information CYCLE2 in the second register 620 when the semiconductor memory device 100 outputs the row address XADD and the logic level of the refresh enable signal REFEN generated in the second self refresh operation through the DQ pin 220. The most significant bit DQ0 having a value of "1" for all rows indicates that the second self refresh operation is performed on every wordline, and not the first self refresh operation.

Figure 11C:
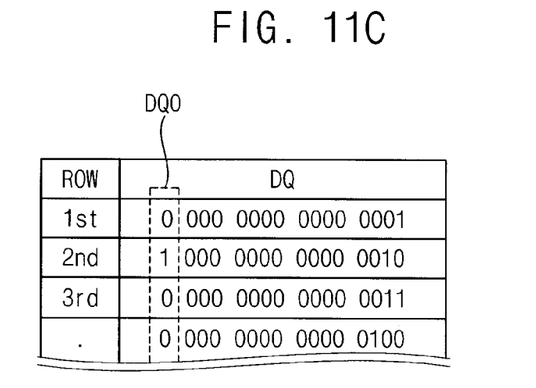
FIG. 11C illustrates the identification information stored in the third register in FIG. 8, according to illustrative embodiments.

FIG. 11C illustrates the identification information stored in the third register in FIG. 8, according to illustrative embodiments.

The identification information stored in the third register 640 corresponds to the result of the AND operation performed on the first self refresh performance information CYCLE1 stored in the first register 610 and the second self refresh performance information CYCLE2 stored in the second register 620. A most significant bit DQ0 of the identification information for the second row has a value of "1," and a most significant bit DQ0 of the identification information for the first and third rows has a value of "0," as illustrated in FIG. 11C. Accordingly, in the depicted example, the first self refresh operation with a cycle of 64 ms is performed on the second row, and the second self refresh operation with a cycle of 128 ms is performed on the first and third rows, for example.

Figure 11D:
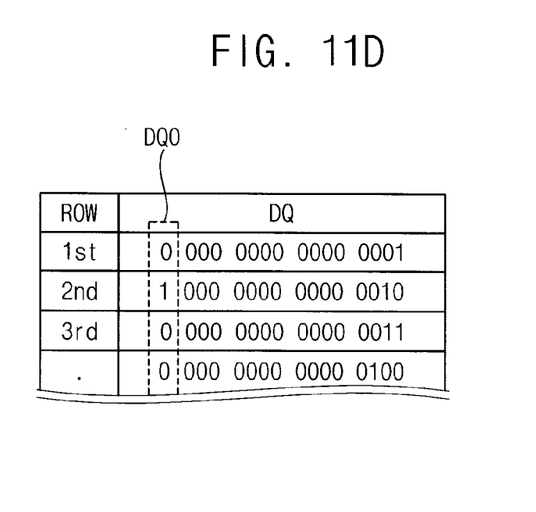
FIG. 11D illustrates the refresh cycle information stored in the third register in FIG. 8, according to illustrative embodiments.

FIG. 11D illustrates the refresh cycle information stored in the third register in FIG. 8, according to illustrative embodiments.

The refresh cycle information TI stored in the third register 650 is same as the refresh cycle information TI stored in the TIR 210. As illustrated in FIG. 11D, a most significant bit DQ0 of refresh cycle information TI for the first and third rows has a value of "1" indicating a self refresh cycle of 128 ms and a most significant bit DQ0 of refresh cycle information TI for the second row has a value of "0" indicating a self refresh cycle of 64 ms, for example.

The decision signal DS has a logic high level, when the identification information stored in the third register 640 is identical to the refresh cycle information TI stored in the fourth register 650. When the decision signal DS has a logic high level, it is confirmed that the multi-cycle self refresh operation is performed on the memory cell array 190 individually with respect to the row addresses according to the refresh cycle information TI stored in the TIR 210.

It is understood that various illustrative embodiments may include verifying a multi-cycle self refresh operation which is performed with three or more than different refresh cycles, without departing from the scope of the present teachings.

As mentioned above, the semiconductor memory device performing the multi-cycle self refresh operation is capable of outputting externally through the DQ pin the refresh cycle information stored in the tag information register and whether the refresh enable signal according to the refresh address is enabled. In addition, whether the multi-cycle self refresh operation is performed is verified externally based on the refresh address and the refresh enable signal. The illustrative embodiments may be applicable to various memory fields and test fields.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A semiconductor memory device comprising:
a memory cell array comprising a plurality of memory cells divided into first cells and second cells according to corresponding data retention times;
a tag information register configured to store refresh cycle information for each wordline connected to the first cells and the second cells;
a refresh control circuit configured to generate a refresh enable signal and a refresh address based on the refresh cycle information; and
an output configured to transmit the refresh enable signal, the refresh address and data stored in the memory cell array externally.

2. The semiconductor memory device of claim 1, wherein a data retention time of each of the first cells is shorter than a data retention time of each of the second cells.

3. The semiconductor memory device of claim 1, wherein the refresh enable signal applied to each wordline has a logic level depending on whether the wordline is connected to a row including at least one first cell.

4. The semiconductor memory device of claim 3, wherein the refresh enable signal is consecutively applied twice to wordlines connected to rows including at least one first cell, and the refresh enable signal is applied once to a row including second cells and not including at least one first cell.

5. The semiconductor memory device of claim 1, wherein a cycle of a self refresh operation performed on the memory cell array based on the refresh address is set individually with respect to each wordline.

6. The semiconductor memory device of claim 1, wherein the refresh control circuit comprises:
an oscillator that generates a pulse signal in response to a refresh command;
an address counter that generates the refresh address in synchronization with the pulse signal; and
a refresh enable signal generator that generates the refresh enable signal, which is selectively enabled according to a corresponding wordline based on the refresh cycle information.

7. The semiconductor memory device of claim 1, wherein the refresh cycle information is transmitted externally through the output.

8. A method of verifying a multi-cycle self refresh operation of a semiconductor memory device comprising a memory cell array, the method comprising:
storing first self refresh performance information with respect to each wordline of a plurality of wordlines, connected to the memory cell array, in a first register of a tester through a DQ pin, the first self refresh performance information being associated with a first self refresh operation performed on memory cells in the memory cell array according to refresh cycle information of each wordline stored in a tag information register;
storing a second self refresh performance information with respect to each wordline in a second register in the tester through the DQ pin, the second self refresh performance information being associated with a second self refresh operation performed on the memory cells according to the refresh cycle information; and
determining whether a multi-cycle self refresh operation is performed on the memory cells based on the refresh cycle information, the first self refresh performance information and the second self refresh performance information.

9. The method of claim 8, wherein determining whether the multi-cycle self refresh operation is performed comprises:
storing identification information in a third register in the tester by performing an AND operation on the first self refresh performance information stored in the first register and the second self refresh performance information stored in the second register; and
determining whether the identification information stored in the third register is identical to the refresh cycle information.

10. The method of claim 9, wherein determining whether the identification information stored in the third register is identical to the refresh cycle information comprises performing an exclusive NOR operation on the identification information and the refresh cycle information.

11. The method of claim 8, wherein the first self refresh performance information includes whether the refresh enable signal applied to each wordline is enabled and a row address designating each wordline associated with the first self refresh operation.

12. The method of claim 11, wherein the second self refresh performance information includes whether the refresh enable signal applied to each wordline is enabled and a row address designating each wordline associated with the second self refresh operation.

13. The method of claim 12, wherein the refresh enable signal is applied to wordlines connected to at least one first cell having a data retention time shorter than a data retention time of second cells when the first self refresh operation is performed.

14. The method of claim 13, wherein the refresh enable signal is applied to each wordline without regard to whether at least one first cell is connected when the second self refresh operation is performed.

15. The method of claim 8, wherein a cycle of self refresh operation performed on the memory cells based on the refresh address is set individually with respect to each wordline.

16. A test system comprising:
a test board comprising a socket on which a semiconductor memory device to be tested is mounted, the semiconductor memory device performing a multi-cycle self refresh operation using refresh cycle information of each row address stored in a tag information register; and
a tester configured to verify the multi-cycle self refresh operation performed in the semiconductor memory device based on a refresh address, a refresh enable signal according to the refresh address and the refresh cycle information, the refresh address and the refresh enable signal being output when a refresh operation is performed in the semiconductor memory device.

17. The test system of claim 16, wherein the tester comprises:
a first register that stores first self refresh performance information associated with a first self refresh operation performed on memory cells in the semiconductor memory device;
a second register that stores second self refresh performance information associated with a second self refresh operation performed on the memory cells;
a third register that stores a result of an AND operation performed on the first self refresh performance information and the second self refresh performance information; and
a fourth register that stores the refresh cycle information of each row address.

18. The test system of claim 17, wherein the tester further comprises:
an exclusive NOR gate that performs an exclusive NOR operation on the result of the AND operation stored in the third register and the refresh cycle information stored in the fourth register.

19. The test system of claim 16, wherein the refresh address and whether the refresh enable signal is enabled are transmitted to the tester through a DQ pin of the semiconductor memory device.

20. The test system of claim 16, wherein the semiconductor memory device comprises a plurality of memory cells divided into first cells and second cells according to corresponding data retention times.

* * * * *